United States Patent
Andriessen

(10) Patent No.: US 7,056,600 B2
(45) Date of Patent: *Jun. 6, 2006

(54) LAYER CONFIGURATION COMPRISING AN ELECTRON-BLOCKING ELEMENT

(75) Inventor: Hieronymus Andriessen, Beerse (BE)

(73) Assignee: Agfa Gevaert, Mortsel (BE)

( * ) Notice: Subject to any disclaimer, the term of this patent is extended or adjusted under 35 U.S.C. 154(b) by 23 days.

This patent is subject to a terminal disclaimer.

(21) Appl. No.: 10/638,918

(22) Filed: Aug. 11, 2003

(65) Prior Publication Data

US 2004/0044214 A1     Mar. 4, 2004

Related U.S. Application Data

(60) Provisional application No. 60/409,731, filed on Sep. 11, 2002.

(30) Foreign Application Priority Data

Aug. 23, 2002 (EP) .................................. 02102216
Feb. 13, 2003 (EP) .................................. 03100327

(51) Int. Cl.
   *C07D 211/02* (2006.01)
(52) U.S. Cl. ...................... 428/690; 428/917; 546/185; 257/40; 257/E51.03
(58) Field of Classification Search ................ 428/690, 428/917, 411.11; 546/185; 257/40, E51.03; 252/500

See application file for complete search history.

(56) References Cited

U.S. PATENT DOCUMENTS 5,111,327 A * 5/1992 Blohm et al.
5,187,608 A * 2/1993 Blohm et al. ................ 359/273

(Continued)

FOREIGN PATENT DOCUMENTS

EP         0 686 662 A2 * 12/1995

(Continued)

OTHER PUBLICATIONS

Lee et al; *Advanced Materials*, vol. 13 (16), 1274-1278, (2001).

Lee et al; *J. of Applied Physics*, vol. 90 (5), 2128-2134 (Sep. 2001).

*Primary Examiner*—Rena Dye
*Assistant Examiner*—Camie S. Thompson
(74) *Attorney, Agent, or Firm*—Leydig, Voit & Mayer, Ltd.

(57) ABSTRACT

A layer configuration on a support, the layer configuration comprising a non-photoactive element exclusive of poly(3, 4-alkylenedioxythiophene)s and poly(3,4-dialkoxythiophene)s, the element containing a first polymer containing structural units according to formula (I):

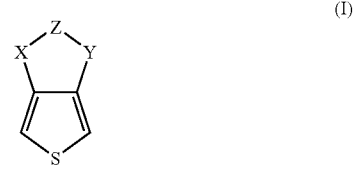

Figure 1:
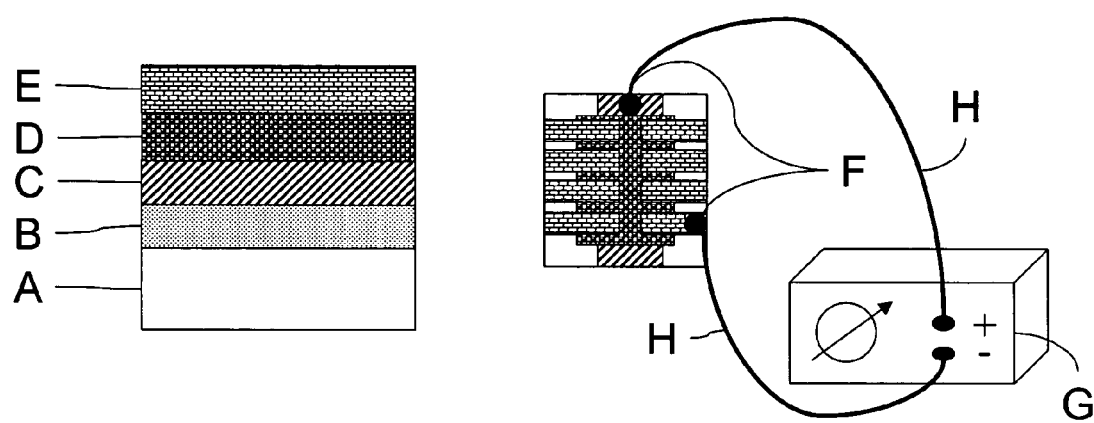
Figure 1:
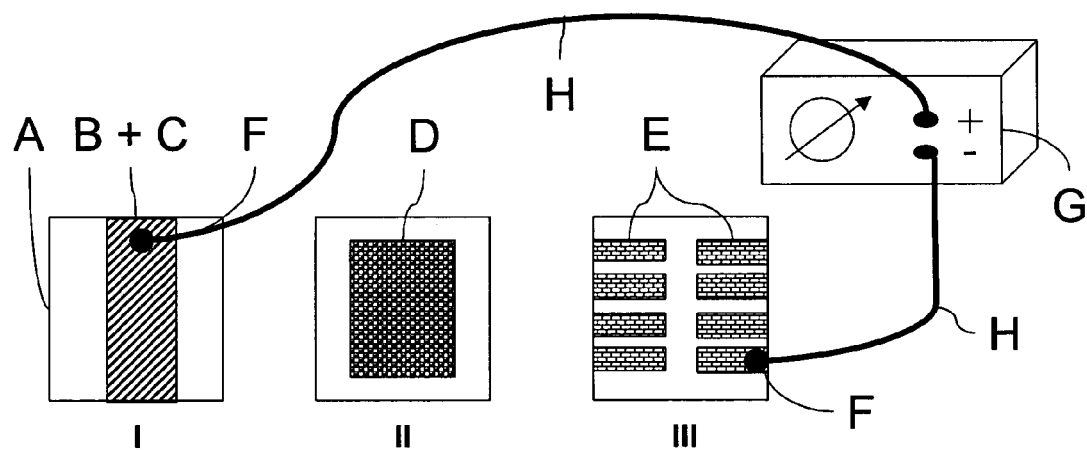

in which X and Y are independently O, S, N—$R^1$, Z is —$(CH_2)_m$—$CR^2R^3$—$(CH_2)_n$—; $R^1$ is aryl, $C_{1-18}$-alkyl or hydrogen; $R^2$ is hydrogen or —$(CH_2)_s$—O—$(CH_2)_p$—$SO_3^-M^+$; $R^3$ is —$(CH_2)_s$—O—$(CH_2)_p$—$SO_3^-M^+$; $M^+$ is a cation; m and n are independently a whole number from 0 to 3; s is a whole number from 0 to 10; and p is a whole number from 1 to 18, and a second polymer different from the first polymer and selected from the group consisting of optionally quaternized polyamine-polymers, polysulpho-polymers, polyphosphoric acids and polyphosphoric acid salts, the surface of one side of the element being contiguous with a positive electrode and the surface on the opposite side of the element being contiguous with a material capable of transporting holes.

30 Claims, 1 Drawing Sheet

U.S. PATENT DOCUMENTS 6,206,937 B1 * 3/2001 Kudoh et al.
6,635,729 B1 * 10/2003 Groenendaal et al. ...... 526/256
2004/0036067 A1 * 2/2004 Andriessen ................. 257/40
2004/0040594 A1 * 3/2004 Andriessen ................. 136/263

FOREIGN PATENT DOCUMENTS

| EP | 0 961 158 A2 * | 12/1999 |
| EP | 1 122 274 A1 | 8/2001 |
| EP | 1 231 250 A1 * | 8/2002 |
| EP | 1 231 251 A1 * | 8/2002 |
| WO | WO 00/06665 A1 * | 2/2000 |
| WO | WO 00/65653 A1 * | 11/2000 |
| WO | WO 01/78464 A1 | 10/2001 |

* cited by examiner

LAYER CONFIGURATION COMPRISING AN ELECTRON-BLOCKING ELEMENT

This application claims the benefit of U.S. Provisional Application No. 60/409,731 filed Sep. 11, 2002, which is incorporated by reference. In addition, this application claims the benefit of European Application No. 02102216.5 filed Aug. 23, 2002, and European Application No. 03100327.0 filed Feb. 13, 2003, which are also incorporated by reference.

FIELD OF THE INVENTION

The present invention relates to a layer configuration comprising an electron-blocking element.

BACKGROUND OF THE INVENTION

Polythiophenes have been studied extensively due to their interesting electrical and/or optical properties. Polythiophenes become electrically conducting upon chemical or electrochemical oxidation or reduction. Their ultimately achievable electrical conductivity is determined by their chemical composition, the stereoregularity of the polymerization of the thiophene monomers in the polythiophene chain and by their π-conjugation lengths. Such stereoregularity problems do not arise when unsubstituted thiophenes or thiophenes substituted in the 3- and 4-positions with identical groups are polymerized.

WO 00/65653 discloses a method in the fabrication of an organic thin-film semiconducting device, wherein the semiconducting device comprises an electrode arrangement with electrodes contacting a semiconducting organic material, and wherein the method is characterized by depositing a first layer of a conducting or semiconducting material in the form of a combination of a conducting and a semiconducting material in the form of a patterned or non-patterned layer on an insulating substrate, such that at least a portion of the substrate is covered by the first layer; modifying the work function of the conducting layer and/or semiconducting material of the first layer by depositing a second layer of a conducting polymer with a work function higher than that of the material in the first layer such that the layer of the conducting polymer mainly covers the first layer or is conformal with the latter, whereby the combination of the first layer and the second layer constitutes the anode of the electrode arrangement and the work function of the anode becomes substantially equal to that of the conducting polymer, depositing a third layer of a semiconducting organic material on the top of the anode, and optionally and in casse only a portion of the substrate is covered by the anode, also above at least some of the portion of the substrate not covered by the anode; and depositing a paterned or non-patterned fourth layer of a meatl on the top of the third layer, whereby the fourth layer constitutes the cathode of the electrode arrangement. WO 00/65653 discloses that the conducting polymer in the second layer is a doped conjugated polymer e.g. poly(3,4-ethylenedioxythiophene) (PEDOT), a copolymer which includes the monomer 3,4-ethylenedioxythiophene, substituted poly(thiophenes), substituted poly(thiophenes), substituted poly(pyrroles), substituted poly(anilines) or copolymers thereof, with the dopant being preferably poly(4-styrene sulphonate) (PSS).

WO 00/06665 discloses an electroluminescent device comprising a light-emitting organic film, arranged between an anode material and a cathide material such that under an applied voltage, the device is forward biased and holes are injected from the anode material into the organic film adjacent to the anode material and electrons are injected from the cathode material into the organic film adjacent to the cathode material, resulting in light emission from the light-emitting organic film; wherein the device additionally comprises a solution-processed film of a blend of an acid-functional non-conductive polymer e.g. polymers having pendant groups selected from sulfonic acid, sulfinic acid, carboxylic acid, phosphoric acid, phosphonic acid, phosphinic acid, and —N+(R)$_2$H where R is selected from hydrogen, C$_1$–C$_{20}$ hydrocarbyl, hydroxy, alkoxy, and aryloxy, and a conductive polymer positioned between the anode material and the light-emitting organic film, wherein the weight ratio of non-conducting to conducting polymer is at least 0.75:1. WO 00/0665 specifically discloses the following non-conductive polymers: sulfonated polyphenylenes, polyphenylenes bearing carboxylic acid functional groups, poly(styrene sulfonic acid), poly(2-acrylamido-2-methyl-1-propanesulfonic acid), polyacrylic acid, polymethacrylic acid or a mixture thereof.

U.S. Pat. No. 5,111,327 discloses an electro-responsive polymer comprising chemically combined repeat units selected from the class consisting of,

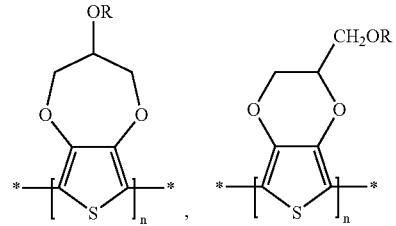

and a mixture thereof where R is a member selected from hydrogen or a C$_{(1-18)}$organic radical.

EP-A 1 122 274 discloses a process for preparing water-soluble π-conjugated polymers, characterized in that the monomer thiophene derivative according to formula (I)

(I)

in which X and Y are independently O, S, N—R$^1$, Z is —(CH$_2$)$_m$—CR$^2$R$^3$—(CH$_2$)$_n$—; R$^1$ is aryl, C$_{1-18}$-alkyl or hydrogen; R$^2$ is hydrogen or —(CH$_2$)$_s$—O—(CH$_2$)$_p$—SO$_3^-$ M$^+$; R$^3$ is —(CH$_2$)$_s$—O—(CH$_2$)$_p$—SO$_3^-$M$^+$; M$^+$ is a cation; m and n are independently a whole number from 0 to 3; s is a whole number from 0 to 10; and p is a whole number from 1 to 18; is polymerized by an oxidation agent in aqueous solution.

WO 01/78464 discloses in an organic/polymer electroluminescent(EL) device which comprises: a transparent substrate; a semitransparent electrode deposited on the transparent substrate; a hole-injecting layer positioned on the semitransparent electrode; an emissive layer made of an organic EL-material, positioned on the hole-injecting layer; and electron-injecting layer positioned on the electron-injecting layer, the improvement comprising that single-ion conductors are employed for the hole-injecting layer and the electron-injecting layer. The specification does not define the meaning of the term "single-ion conductor", which in plain language means a conductor of a single ion, although claim 9 teaches that the single ion conductor can be a single-cation conductor or a single anion conductor and claim 10 teaches that such single ion conductors can be represented as a general formula (I) or (II), comprising ether chain [(—CH$_2$)$_n$O—] such as polyethylene oxide or polypropylene oxide in the main chain, and contains anions such as SO$_3^-$, COO$^-$ or I$^-$ in the main side chains that form ionic bonds with counter ions such as Na$^+$, Li$^+$, Zn$^{2+}$, Mg$^{2+}$, Eu$^{3+}$, or (NH$_3$)$_4^+$:

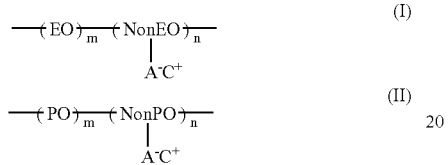

wherein, EO represents ethylene oxide; Non-EO represents non-ethylene oxide; PO represents propylene oxide; Non-PO represents non-propylene oxide; A$^-$ represents anion; C$^+$ represents cation; m+n=11 and n represents a real number more than 0 and less than 1.

T.-W. Lee and O. O. Park disclosed in 2001 in Advanced Materials, volume 13, pages 1274–1278, polymer light-emitting energy-well devices using single-ion conductors (SIC's) in which charge injection and its confinement simultaneously in EL devices is striven for by using both a single-cationic conductor (SCC) and a single-anionic conductor (SAC), which "greatly improve the charge injection due to accumulation of the mobile ions near the electrodes" with the aim of "confining well-electrons and holes leading to enhanced recombination rate of the pairs" in devices in which "the mobile ions to play a key role in improvement of charge injection are separately located near both electrodes in the structure of a sandwiched multi-layer device instead of blending with the emitting material so that the problem of phase separation of the emitting materials can be avoided". They further disclose that ionic polyurethane possesses good mechanical properties and high ionic conductivity with a single-ion transport character and that SIC's are generally of two different types: one is a polymer blend of an ionomer and polyether which usually possesses poor mechanical properties and the other is the copolymer of an oligomeric ionomer with polyether. They also disclosed that incorporation of the SIC's with soft and hard blocks into the EL devices dramatically improves not only luminance but also the efficiency and that SCC's possess electron-injecting and hole-blocking properties and SAC's possess hole-injecting and electron-blocking properties.

T.-W. Lee et al. disclosed in 2001 in Journal of Applied Physics, volume 90, pages 2128–2134, a study of the effect of ion concentration, neutralization level and counterions in ionomers to obtain the optimal electroluminescent (EL) characteristics in polymer light-emitting diodes using poly[2-methoxy-5-(2'-ethylhexyloxy)-1,4-phenylenevinylene] (MEH-PPV) for the emissive layer and sulphonated polystyrene (SPS) ionomers for the electron-injecting layer.

A general problem in electronic devices, particularly in light emitting diodes, is undesirable hole-electron recombination at the positive electrode thereby reducing the efficiency and lifetime of the device.

ASPECTS OF THE INVENTION

It is therefore an aspect of the present invention to provide an element between a positive electrode and a material capable of hole transport capable of reducing hole-electron recombination at the positive electrode thereby increasing the efficiency and lifetime of electronic devices containing such layer configurations.

Further aspects and advantages of the invention will become apparent from the description hereinafter.

SUMMARY OF THE INVENTION

It has been surprisingly found that the use of an element containing a polymer containing structural units according to formula (I)

in which X and Y are independently O, S, N—R$^1$, Z is —(CH$_2$)$_m$—CR$^2$R$^3$—(CH$_2$)$_n$—; R$^1$ is aryl, C$_{1-18}$-alkyl or hydrogen; R$^2$ is hydrogen or —(CH$_2$)$_s$—O—(CH$_2$)$_p$—SO$_3^-$M$^+$; R$^3$ is —(CH$_2$)$_s$—O—(CH$_2$)$_p$—SO$_3^-$M$^+$; M$^+$ is a cation; m and n are independently a whole number from 0 to 3; s is a whole number from 0 to 10; and p is a whole number from 1 to 18, and a second polymer different from the first polymer and selected from the group consisting of optionally quaternized polyamine-polymers, polysulpho-polymers, polyphosphoric acids and polyphosphoric acid salts between a positive electrode and a material capable of hole transport improves the device performance by increasing the lifetime and in the case of light emitting diodes the reducing the optimum voltage.

Aspects of the present invention are realized by a layer configuration on a support, the layer configuration comprising a non-photoactive element exclusive of poly(3,4-alkylenedioxythiophene)s and poly(3,4-dialkoxythiophene)s containing a first polymer containing structural units according to formula (I):

in which X and Y are independently O, S, N—R$^1$, Z is —(CH$_2$)$_m$—CR$^2$R$^3$—(CH$_2$)$_n$—; R$^1$ is aryl, C$_{1-18}$-alkyl or hydrogen; R$^2$ is hydrogen or —(CH$_2$)$_s$—O—(CH$_2$)$_p$—SO$_3^-$M$^+$; R$^3$ is —(CH$_2$)$_s$—O—(CH$_2$)$_p$—SO$_3^-$M$^+$; M$^+$ is a cation; m and n are independently a whole number from 0 to 3; s is a whole number from 0 to 10; and p is a whole number from 1 to 18, and a second polymer different from the first polymer and selected from the group consisting of optionally quaternized polyamine-polymers, polysulpho-polymers, polyphosphoric acids and polyphosphoric acid salts, the surface of one side of the element being contiguous with a positive electrode and the surface on the opposite side of the element being contiguous with a material capable of transporting holes.

Preferred embodiments are disclosed in the dependent claims.

DETAILED DESCRIPTION OF THE INVENTION

FIG. 1 is a schematic representation of a side view and a top view of the layer configuration used in devices 2 to 14 and 16 to 37 and the circuit used for obtaining electroluminescence in which:

A represents a poly(ethylene terephthalate) support;
B represents an sputtered ITO layer;
C represents an electron blocking layer;
D represents an electroluminescent layer containing ZnS:Cu nanoparticles and a binder;
E represents an evaporated aluminium electrode
F represents conductive silver paste dots for contacting
G represents IV-power source (Power Supply ES 030-5 of Delta Elektronica)
H represents electric conductive copper wires
I indicates the first layer
II indicates the second layer
III indicates the third layer

DEFINITIONS

The term alkyl means all variants possible for each number of carbon atoms in the alkyl group i.e. for three carbon atoms: n-propyl and isopropyl; for four carbon atoms: n-butyl, isobutyl and tertiary-butyl; for five carbon atoms: n-pentyl, 1,1-dimethylpropyl, 2,2-dimethylpropyl and 2-methyl-butyl etc.

The term aqueous for the purposes of the present invention means containing at least 60% by volume of water, preferably at least 80% by volume of water, and optionally containing water-miscible organic solvents such as alcohols e.g. methanol, ethanol, 2-propanol, butanol, iso-amyl alcohol, octanol, cetyl alcohol etc.; glycols e.g. ethylene glycol; glycerine; N-methylpyrrolidone; methoxypropanol; and ketones e.g. 2-propanone and 2-butanone etc.

The term element as used in disclosing the present invention means a single layer containing both the first polymer and the second polymer or two contiguous layers wherein the innermost layer of the element with respect to the support contains the first polymer and the outermost layer with respect to the support contains the second polymer.

The term polymer includes homopolymers, copolymers, terpolymers, graft polymers and block copolymers and both chain and condensation polymers.

The abbreviation PEDOT-S represents poly[4-(2,3-dihydrothieno[3,4-b][1,4]dioxin-2-ylmethoxy)-butane-1-sulphonic acid].

The abbreviation PSS represents poly(styrene sulphonic acid) or poly(styrenesulphonate).

The term tosylate represents p-toluenesulphonate.

The abbreviation HTs represents p-toluenesulphonic acid and Ts⁻ or tosylate represents p-toluenesulphonate.

The term "non-photoactive element" as used in disclosing the present invention means an element which is not photoactive, where photoactive means either capable of reacting to light or capable of emitting light.

The term poly(3,4-alkylenedioxythiophene) as used in disclosing the present invention means a polythiophene in which the 3 and 4 positions in the thiophene ring are linked by a —O-alkylene-O— group, where the term alkylene means a saturated hydrocarbon group containing the carbon atoms linking the two oxygen atoms in the —O-alkylene-O— group and also saturated hydrocarbon groups containing the carbon atoms linking the two oxygen atoms in the —O-alkylene-O— group in which these carbon atoms are covalently linked with one or more alkyl groups.

The term polysulfo-polymer as used in disclosing the present invention means a polymer with more than one sulphonic acid groups with the exclusion of the first polymer according to formula (I).

The passage "material capable of transporting holes" as used in disclosing the present invention means a material into which holes can be injected and through which holes can be transported, preferably having a hole mobility >10⁻⁸ cm² V⁻¹ s⁻¹ and particularly preferably having a hole mobility >10⁻⁶ cm² V⁻¹ s⁻¹ as measured by time of flight techniques or in a field effect transistor.

Layer Configuration

Aspects of the present invention are realized with a layer configuration on a support, the layer configuration comprising a non-photoactive element exclusive of poly(3,4-alkylenedioxythiophene)s and poly(3,4-dialkoxythiophene)s, the element containing a first polymer containing structural units according to formula (I):

in which X and Y are independently O, S, N—R$^1$, Z is —(CH$_2$)$_m$—CR$^2$R$^3$—(CH$_2$)$_n$—; R$^1$ is aryl, C$_{1-18}$-alkyl or hydrogen; R$^2$ is hydrogen or —(CH$_2$)$_s$—O—(CH$_2$)$_p$—SO$_3^-$M$^+$; R$^3$ is —(CH$_2$)$_s$—O—(CH$_2$)$_p$—SO$_3^-$M$^+$; M$^+$ is a cation; m and n are independently a whole number from 0 to 3; s is a whole number from 0 to 10; and p is a whole number from 1 to 18, and a second polymer different from the first polymer and selected from the group consisting of optionally quaternized polyamine-polymers, polysulpho-polymers, polyphosphoric acids and polyphosphoric acid salts, the surface of one side of the element being contiguous with a positive electrode and the surface on the opposite side of the element being contiguous with a material capable of transporting holes.

According to a first embodiment of the layer configuration, according to the present invention, the weight ratio of the second polymer to the first polymer is in the range of 1:1 to 20:1.

According to a second embodiment of the layer configuration, according to the present invention, the element further contains a surfactant.

According to a third embodiment of the layer configuration, according to the present invention, the element further contains a binder.

According to a fourth embodiment of the layer configuration, according to the present invention, the element further contains a cross-linking agent.

According to a fifth embodiment of the layer configuration, according to the present invention, the layer configuration is a transistor.

According to a sixth embodiment of the layer configuration, according to the present invention, the layer configuration is an electroluminescent device.

The element is preferably prepared by spincoating the coating or coatings from aqueous or solvent media. Solutions or dispersions for spincoating preferably have viscosities of about 2 to 3 cP meaning that up to 95% of the solution is spun off i.e. not deposited during the spincoating process. If the element is prepared by the application of two coatings the first coating is preferably dried in a drying cupboard before the second coating is applied. Depending upon the ingredients and solvents/dispersion media used in the two coatings the two coatings will form a single homogeneous layer after the second coating or two identifiable layers.

First Polymer

The first polymer, according to the present invention, contains structural units according to formula (I):

(I)

in which X and Y are independently O, S, N—$R^1$, Z is —$(CH_2)_m$—$CR^2R^3$—$(CH_2)_n$—; $R^1$ is aryl, $C_{1-18}$-alkyl or hydrogen; $R^2$ is hydrogen or —$(CH_2)_s$—O—$(CH_2)_p$—$SO_3^-$$M^+$; $R^3$ is —$(CH_2)_s$—O—$(CH_2)_p$—$SO_3^-M^+$; $M^+$ is a cation; m and n are independently a whole number from 0 to 3; s is a whole number from 0 to 10; and p is a whole number from 1 to 18.

According to a seventh embodiment of the layer configuration, according to the present invention, the first polymer is a polythiophene according to formula (II)

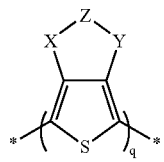

(II)

in which X and Y are independently O, S, N—$R^1$, Z is —$(CH_2)_m$—$CR^2R^3$—$(CH_2)_n$—; $R^1$ is aryl, $C_{1-18}$-alkyl or hydrogen; $R^2$ is hydrogen or —$(CH_2)_s$—O—$(CH_2)_p$—$SO_3^-$$M^+$; $R^3$ is —$(CH_2)_s$—O—$(CH_2)_p$—$SO_3^-M^+$; $M^+$ is a cation; m and n are independently a whole number from 0 to 3; s is a whole number from 0 to 10; and p is a whole number from 1 to 18; and q is a whole number from 2 to 10,000.

According to an eighth embodiment of the layer configuration, according to the present invention, the first polymer is poly[4-(2,3-dihydro-thieno[3,4-b][1,4]dioxin-2-yl-methoxy)-butane-1-sulphonic acid].

Organic polymer containing structural units according to formula (I) can be polymerized chemically or electrochemically. Chemical polymerization can be carried out oxidatively or reductively. The oxidation agents used for the oxidative polymerisation of pyrrole, such as described for example in Journal of the American Chemical Society, volume 85, pages 454–458 (1963) and *J. Polymer Science Part A Polymer Chemistry*, volume 26, pages 1287–1294 (1988), can be utilized for the oxidative polymerization of thiophenes. According to a seventh embodiment of the present invention, the inexpensive and easily accessible oxidation agents such as iron(III) salts such as $FeCl_3$, the iron(III) salts of organic acids, e.g. $Fe(OTs)_3$, $H_2O_2$, $K_2Cr_2O_7$, alkali and ammonium persulphates, alkali perborates and potassium permanganate are used in the oxidative polymerization.

Theoretically the oxidative polymerization of thiophenes requires 2.25 equivalents of oxidation agent per mole thiophene of formula (I) [see e.g. J. Polymer Science Part A Polymer Chemistry, volume 26, pages 1287–1294 (1988)]. In practice an excess of 0.1 to 2 equivalents of oxidation agent is used per polymerizable unit. The use of persulphates and iron(III) salts has the great technical advantage that they do not act corrosively. Furthermore, in the presence of particular additives oxidative polymerization of the thiophene compounds according to formula (I) proceeds so slowly that the thiophenes and oxidation agent can be brought together as a solution or paste and applied to the substrate to be treated. After application of such solutions or pastes the oxidative polymerization can be accelerated by heating the coated substrate as disclosed in U.S. Pat. No. 6,001,281 and WO 00/14139 herein incorporated by reference.

Reductive polymerization can be performed using the Stille (organotin) or Suzuki (organoboron) routes described in 2002 by Appperloo et al. in Chem. Eur. Journal, volume 8, pages 2384–2396, and as disclosed in 2001 in Tetrahedron Letters, volume 42, pages 155–157 and in 1998 in Macromolecules, volume 31, pages 2047–2056 respectively or with nickel complexes as disclosed in 1999 in Bull. Chem. Soc. Japan, volume 72, page 621 and in 1998 in Advanced Materials, volume 10, pages 93–116.

Structural units according to formula (I) can be chemically or electrochemically copolymerized with other thiophene monomer, such as optionally substituted 3,4-dialkoxythiophenes e.g. optionally substituted 3,4-alkylenedioxythiophenes, or polymerizable heterocyclic compounds such as pyrrole.

Polyamine-polymers

Aspects of the present invention are realized with a layer configuration on a support, the layer configuration comprising a non-photoactive element exclusive of poly(3,4-alkylenedioxythiophene)s and poly(3,4-dialkoxythiophene)s, the element containing a first polymer containing structural units according to formula (I):

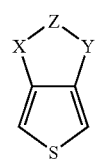

(I)

in which X and Y are independently O, S, N—$R^1$, Z is —$(CH_2)_m$—$CR^2R^3$—$(CH_2)_n$—; $R^1$ is aryl, $C_{1-18}$-alkyl or hydrogen; $R^2$ is hydrogen or —$(CH_2)_s$—O—$(CH_2)_p$—$SO_3^-$ $M^+$; $R^3$ is —$(CH_2)_s$—O—$(CH_2)_p$—$SO_3^-M^+$; $M^+$ is a cation; m and n are independently a whole number from 0 to 3; s is a whole number from 0 to 10; and p is a whole number from 1 to 18, and a second polymer which is an optionally quaternized polyamine-polymer, the surface of one side of the element being contiguous with a positive electrode and the surface on the opposite side of the element being contiguous with a material capable of transporting holes.

Optionally quaternized polyamine-polymers include both optionally quaternized aliphatic polyamine-polymers, e.g. polyallylamine hydrochloride and polymers with optionally quaternized nitrogen-containing heteroaromatic groups, e.g. homopolymers and copolymers of optionally substituted vinylpyridines, vinyldipyridyls, vinylquinolines, vinylisoquinolines, vinylacridines, vinylpyridazines, vinylpyrimidines, vinylpyrazines, vinyltriazine, vinylcinnolines, vinylphthalazines, vinylquinazolines, vinylquinoxalines, vinylpteridines, vinyloxadiazole and vinyloxazole.

According to a ninth embodiment of the layer configuration, according to the present invention, the optionally quaternized polyamine-polymer is an optionally quaternized polyvinylpyridine or a copolymer of an optionally quaternized vinyl pyridine.

Suitable polyamine-polymers, according to the present invention, include:

| | Composition | |
|---|---|---|
| POLY-01 | copolymer of 28.5 mol % acrylamide and 71.5 mol % 4-vinylpyridine | |
| POLY-02 | terpolymer of 83.5 mol % acrylamide, 15 mol % 4-vinylpyridine and 1.5 mol % N-vinylimidazole | |
| POLY-03 | poly(4-vinylpyridine) | from Aldrich |
| POLY-04 | poly(allylamine) | from Aldrich |
| POLY-05 | copolymer of 10% by weight n-butyl acrylate and 90% by weight of 4-vinylpyridine | from Aldrich |
| POLY-06 | copolymer of 10% by weight styrene and 90% by weight 4-vinylpyridine | from Aldrich |
| POLY-07 | copolymer of 30% by weight styrene and 70% by weight 2-vinylpyridine | from Aldrich |

Polysulpho-polymer

Aspects of the present invention are realized with a layer configuration on a support, the layer configuration comprising a non-photoactive element exclusive of poly(3,4-alkylenedioxythiophene)s and poly(3,4-dialkoxythiophene)s, the element containing a first polymer containing structural units according to formula (I):

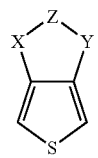

(I)

in which X and Y are independently O, S, N—$R^1$, Z is —$(CH_2)_m$—$CR^2R^3$—$(CH_2)_n$—; $R^1$ is aryl, $C_{1-18}$-alkyl or hydrogen; $R^2$ is hydrogen or —$(CH_2)_s$—O—$(CH_2)_p$—$SO_3^-$ $M^+$; $R^3$ is —$(CH_2)_s$—O—$(CH_2)_p$—$SO_3$ $M^+$; $M^+$ is a cation; m and n are independently a whole number from 0 to 3; s is a whole number from 0 to 10; and p is a whole number from 1 to 18, and a second polymer which is different from the first polymer and is a polysulpho-polymer, the surface of one side of the element being contiguous with a positive electrode and the surface on the opposite side of the element being contiguous with a material capable of transporting holes.

Suitable polysulpho-polymers, according to the present invention, include:

| | |
|---|---|
| POLYSULPHO-1 | poly(sulphonic acid) |
| POLYSULPHO-2 | polyvinylsulphonic acid |
| POLYSULPHO-3 | sodium salt of a poly[N-(1',1'-dimethyl-2'-sulpho-ethyl)-acrylamide] |
| POLYSULPHO-4 | sodium salt of a copolymer of 90% by weight N-(1',1'-dimethyl-2'-sulpho-ethyl)-acrylamide and 10% by weight acrylamide |
| POLYSULPHO-5 | sodium salt of a copolymer of 50 mol % ethylene glycol, 46.5 mol % terephthalic acid and 3.5 mol % 5-sulpho-isophthalic acid |

Polyphosphoric Acids and Salts thereof

Aspects of the present invention are realized with a layer configuration on a support, the layer configuration comprising a non-photoactive element exclusive of poly(3,4-alkylenedioxythiophene)s and poly(3,4-dialkoxythiophene)s, the element containing a first polymer containing structural units according to formula (I):

(I)

in which X and Y are independently O, S, N—$R^1$, Z is —$(CH_2)_m$—$CR^2R^3$—$(CH_2)_n$—; $R^1$ is aryl, $C_{1-18}$-alkyl or hydrogen; $R^2$ is hydrogen or —$(CH_2)_s$—O—$(CH_2)_p$—$SO_3^-$ $M^+$; $R^3$ is —$(CH_2)_s$—O—$(CH_2)_p$—$SO_3^-M^+$; $M^+$ is a cation; m and n are independently a whole number from 0 to 3; s is a whole number from 0 to 10; and p is a whole number from 1 to 18, and a second polymer which is different from the first polymer and is a polyphosphoric acid or a polyphosphoric acid salt, the surface of one side of the layer being contiguous with a positive electrode and the surface on the opposite side of the layer being contiguous with a material capable of transporting holes.

Polyphosphoric acids include diphosphoric acid, pyrophosphoric acid, triphosphoric acid, tetraphosphoric acid, metaphosphoric acid and "polyphosphoric acid".

Polyphosphoric acid may be prepared by heating $H_3PO_4$ with sufficient $P_4O_{10}$ (phosphoric anhydride) or by heating $H_3PO_4$ to remove water. A $P_4O_{10}/H_2O$ mixture containing 72.74% $P_4O_{10}$ corresponds to pure $H_3PO_4$, but the usual commercial grades of the acid contain more water. As the $P_4O_{10}$ content $H_4P_2O_7$, pyrophosphoric acid, forms along with $P_3$ through $P_8$ polyphosphoric acids. Triphosphoric acid appears at 71.7% $P_2O_5$ ($H_5P_3O_{10}$) and tetraphosphoric acid ($H_6P_4O_{13}$) at about 75.5% $P_2O_5$. Such linear polyphosphoric acids have 2 to 15 phosphorus atoms, which each bear a strongly acidic OH group. In addition, the two terminal P atoms are each bonded to a weakly acidic OH group. Cyclic polyphosphoric acids or metaphosphoric acids, $H_nP_nO_{3n}$, which are formed from low-molecular polyphosphoric acids by ring closure, have a comparatively small number of ring atoms (n=3–8). Each atom in the ring is bound to one strongly acidic OH group. High linear and cyclic polyphosphoric acids are present only at acid concentrations above 82% $P_2O_5$. Commercial phosphoric acid has a 82 to 85% by weight $P_2O_5$ content. It consists of about 55% tripolyphosphoric acid, the remainder being $H_3PO_4$ and other polyphosphoric acids.

A polyphosphoric acid suitable for use according to the present invention is a 84% (as $P_2O_5$) polyphosphoric acid supplied by ACROS (Cat. No. 19695-0025).

Surfactants

According to a tenth embodiment of the layer configuration, according to the present invention, the element further contains a non-ionic surfactant e.g. ethoxylated/fluoroalkyl surfactants, polyethoxylated silicone surfactants, polysiloxane/polyether surfactants, ammonium salts of perfluoroalkylcarboxylic acids, polyethoxylated surfactants and fluorine-containing surfactants.

Suitable non-ionic surfactants include:

Surfactant no. 01=ZONYL™ FSN, a 40% by weight solution of $F(CF_2CF_2)_{1-9}CH_2CH_2O(CH_2CH_2O)_xH$ in a 50% by weight solution of isopropanol in water where x=0 to about 25, from DuPont;

Surfactant no. 02=ZONYL™ FSN-100: $F(CF_2CF_2)_{1-9}CH_2CH_2O(CH_2CH_2O)_xH$ where x=0 to about 25, from DuPont;

Surfactant no. 03=ZONYL™ FS300, a 40% by weight aqueous solution of a fluorinated surfactant, from DuPont;

Surfactant no. 04=ZONYL™ FSO, a 50% by weight solution of a mixture of ethoxylated non-ionic fluoro-surfactant with the formula: $F(CF_2CF_2)_{1-7}CH_2CH_2O(CH_2CH_2O)_yH$ where y=0 to ca. 15 in a 50% by weight solution of ethylene glycol in water, from DuPont;

Surfactant no. 05=ZONYL™ FSO-100, a mixture of ethoxylated nonionic fluoro-surfactant from DuPont with the formula: $F(CF_2CF_2)_{1-7}CH_2CH_2O(CH_2CH_2O)_yH$ where y=0 to ca. 15 from DuPont;

Surfactant no. 06=Tegoglide™ 410, a polysiloxane-polymer copolymer surfactant, from Goldschmidt;

Surfactant no. 07=Tegowet™, a polysiloxane-polyester copolymer surfactant, from Goldschmidt;

Surfactant no. 08=FLUORAD™FC431: $CF_3(CF_2)_7SO_2(C_2H_5)N-CH_2CO-(OCH_2CH_2)_nOH$ from 3M;

Surfactant no. 09=FLUORAD™FC126, a mixture of the ammonium salts of perfluorocarboxylic acids, from 3M;

Surfactant no. 10=Polyoxyethylene-10-lauryl ether

Surfactant no. 11=FLUORADT™FC430, a 98.5% active fluoroaliphatic ester from 3M;

According to an eleventh embodiment of the layer configuration, according to the present invention, the element further contains an anionic surfactant.

Suitable anionic surfactants include:

Surfactant no. 12=ZONYL™ 7950, a fluorinated surfactant, from DuPont;

Surfactant no. 13=ZONYL™ FSA, 25% by weight solution of $F(CF_2CF_2)_{1-9}CH_2CH_2SCH_2CH_2COOLi$ in a 50% by weight solution of isopropanol in water, from DuPont;

Surfactant no. 14=ZONYL™ FSE, a 14% by weight solution of $[F(CF_2CF_2)_{1-7}CH_2CH_2O]_xP(O)(ONH_4)_y$ where x=1 or 2; y=2 or 1; and x+y=3 in a 70% by weight solution of ethylene glycol in water, from DuPont;

Surfactant no. 15 ZONYL™ FSJ, a 40% by weight solution of a blend of $[F(CF_2CF_2)_{1-7}CH_2CH_2O]_xP(O)(ONH_4)_y$ where x=1 or 2; y=2 or 1; and x+y=3 with a hydrocarbon surfactant in a 25% by weight solution of isopropanol in water, from DuPont;

Surfactant no. 16=ZONYL™ FSP, a 35% by weight solution of $[F(CF_2CF_2)_{1-7}CH_2CH_2O]_xP(O)(ONH_4)_y$ where x=1 or 2; y=2 or 1 and x+y=3 in 69.2% by weight solution of isopropanol in water, from DuPont;

Surfactant no. 17=ZONYL™ UR: $[F(CF_2CF_2)_{1-7}CH_2CH_2O]_xP(O)(OH)_y$ where x=1 or 2; y=2 or 1 and x+y=3, from DuPont;

Surfactant no. 18=ZONYL™ TBS: a 33% by weight solution of $F(CF_2CF_2)_{3-8}CH_2CH_2SO_3H$ in a 4.5% by weight solution of acetic acid in water, from DuPont;

Surfactant no. 19=ammonium salt of perfluoro-octanoic acid from 3M

Electroluminescent Phosphors

According to a twelfth embodiment of the layer configuration, according to the present invention, the layer configuration further comprises a layer or layers of one or more electroluminescent compound(s). This electroluminescent compound can be pure organic (organic light emitting devices), hybrid (inorganic and organic) or pure inorganic (inorganic light emitting devices).

According to a thirteenth embodiment of the layer configuration, according to the present invention, the layer configuration further comprises a layer of an electroluminescent phosphor, wherein the electroluminescent phosphor belongs to the class of II-VI semiconductors e.g. ZnS, or is a combination of group II elements with oxidic anions, the most common being silicates, phosphates, carbonates, germanates, stannates, borates, vanadates, tungstates and oxysulphates. Typical dopants are metals and all the rare earths e.g. Cu, Ag, Mn, Eu, Sm, Tb and Ce.

According to a fourteenth embodiment of the layer configuration, according to the present invention, the layer configuration further comprises a layer of an electroluminescent phosphor, wherein the electroluminescent phosphor is ZnS doped with manganese, copper or terbium or $CaGa_2S_4$ doped with cerium.

Dielectric Layer

According to a fifteenth embodiment of the layer configuration, according to the present invention, the layer configuration further comprises a dielectric layer.

Any dielectric material may be used in the dielectric layer, with yttria and barium titanate being preferred e.g. the barium titanate paste LUXPRINT™ type 7153E high K dielectric insulator supplied by DuPont and the barium titanate paste ELECTRODAG™ EL-040 supplied by Acheson. A positive ion exchanger may be incorporated into the dielectric layer to capture any ions dissolving escaping from the phosphor of the light-emitting layer. The amount of ion exchanger in the dielectric layer has to be optimized so that it has a maximum effectiveness in reducing black spots while not reducing the initial brightness level. It is therefore preferred to add 0.5 to 50 parts by weight of ion exchanger to 100 parts by weight of the total amount of resin and dielectric material in the dielectric layer. The ion exchanger may be organic or inorganic.

Suitable inorganic ion exchangers are hydrated antimony pentoxide powder, titanium phosphate, salts of phosphoric acid and silicic acid and zeolite.

Support

According to a sixteenth embodiment of the layer configuration, according to the present invention, the support is transparent or translucent.

According to a seventeeth embodiment of the layer configuration, according to the present invention, the support is paper, polymer film, glass or ceramic.

According to an eighteenth embodiment of the layer configuration, according to the present invention, the support is a transparent or translucent polymer film.

A transparent or translucent support suitable for use with the electroconductive or antistatic layers, according to the present invention, may be rigid or flexible and consist of a glass, a glass-polymer laminate, a polymer laminate, a thermoplastic polymer or a duroplastic polymer. Examples of thin flexible supports are those made of a cellulose ester, cellulose triacetate, polypropylene, polycarbonate or polyester, with poly(ethylene terephthalate) or poly(ethylene naphthalene-1,4-dicarboxylate) being particularly preferred.

Electroluminescent Devices

According to a nineteenth embodiment of the layer configuration, according to the present invention, the layer configuration is an electroluminescent device.

According to a twentieth embodiment of the layer configuration, according to the present invention, the layer configuration is a light emitting diode.

Thin film electroluminescent devices (ELDs) are all characterized by one (or more) electroluminescent active layer(s) sandwiched between two electrodes. Optionally a dielectric layer may also be part of the sandwich.

Thin film ELDs can be subdivided into organic and inorganic based ELDs. Organic-based thin film ELDs can be subdivided into low molecular weight organic devices including ologomers (Organic Light Emitting Diodes (OLEDs)) and high molecular weight organic devices (Polymer Light Emitting Diodes (PLEDs). The inorganic ELDs on the other hand can be further subdivided into the High Voltage Alternating Current (HV-AC) ELDs and the Low Voltage Direct Current (LV-DC) ELDs. The LV-DC ELDs include Powder ELDs (DC-PEL Devices or DC-PELDs) and thin film DC-ELDs, hereinafter called Inorganic Light Emitting Diodes (ILEDs).

The basic construction of organic ELDs (PLED and OLED) comprises following layer arrangement: a transparent substrate (glass or flexible plastic), a transparent conductor, e.g. Indium Tin Oxide (ITO), a hole transporting layer, a luminescent layer, and a second electrode, e.g. a Ca, Mg/Ag or Al/Li electrode. For OLEDs the hole transporting layer and the luminescent layer are 10–50 nm thick and applied by vacuum deposition, whereas for PLEDs the hole transporting layer is usually about 40 nm thick and the luminescent layer is usually about 100 nm thick and applied by spin coating or other non-vacuum coating techniques. A direct voltage of 5–10 V is applied between the electrodes and light emission results from holes and electrons being injected from the positive and negative electrodes respectively combining in the luminescent layer to produce the energy to excite the luminescent species to emit light.

In OLEDs the hole transporting layer and electroluminescent layer consist of low molecular organic compounds, N,N'-diphenyl-1,1'-biphenyl-4,4'-diamine (TPD) can, for example be used as the hole transporter and aluminium (III) 8-hydroxyquinoline complex ($Alq_3$), polyaromatics (anthracene derivatives, perylene derivatives and stilbene derivatives) and polyhetero-aromatics (oxazoles, oxadiazoles, thiazoles etc.) can be used as electroluminescent compounds.

In PLEDs electroluminescent compounds that can be used are polymers like the non-conjugated polyvinylcarbazole derivatives (PVK) or conjugated polymers like poly(p-phenylene vinylenes) (PPV), polyfluorenes, poly(3-alkylthiophene), poly(p-phenylene ethynylenes) etc. These high-molecular-weigth materials allow for the easy preparation of thin films by casting, and show a high resistance to crystallization.

Low voltage DC PEL Devices generally comprise a transparent substrate, a transparent conductor (ITO), a doped ZnS phosphor layer (20 μm), and a top electrode of evaporated aluminium. The phosphor layer is applied by means of the doctor blade technique or screen printing on an ITO conducting layer. Subsequently an aluminium electrode is applied by evaporation. Upon applying a direct current voltage of several volts (ITO positive), holes start moving towards the aluminium electrode, thereby creating an insulating region (about 1 μm in thickness) next to the ITO layer within one minute or so. This results in a current drop which is associated with the onset of light emission. This process has been called the forming process. In the thin high resistive phosphor layer thereby formed, high electric fields occur and electroluminescence is already possible at low voltages (typically between 10 and 30 V). Que et al. [see Appl. Phys. Lett., volume 73, pages 2727–2729 (1998)] using ZnS:Cu nano crystals achieved turn on voltages of below 5 V.

In hybrid LEDs, inorganic emitting so-called quantum dots are used in combination with organic polymers with charge transporting properties and in some cases also emitting properties. Hybrid LEDs with CdSe nano particles have been reported by Colvin et al. [see Nature, volume 370, pages 354–357, (1994), Dabbousi et al. [see Appl. Phys. Lett., volume 66, pages 1316–1318 (1995), and Gao et al. [see J. Phys. Chem. B, volume 102, pages 4096–4103 (1998)]; and with ZnS:Cu nano crystals have been reported by Huang et al. [see Appl. Phys. Lett., volume 70, pages 2335–2337 (1997)] all included herein by reference.

Photovoltaic Devices

According to a twenty-first embodiment of the layer configuration, according to the present invention, the layer configuration is a photovoltaic device.

According to a twenty-second embodiment of the layer configuration, according to the present invention, the layer configuration further comprises at least one photovoltaic layer. The photovoltaic layer may be organic layer, a hybrid inorganic and organic layer or an inorganic layer.

According to a twenty-third embodiment of the layer configuration, according to the present invention, the layer configuration is a solar cell.

Photovoltaic devices incorporating the layer configuration, according to the present invention, can be of two types: the regenerative type which converts light into electrical power leaving no net chemical change behind in which current-carrying electrons are transported to the anode and the external circuit and the holes are transported to the cathode where they are oxidized by the electrons from the external circuit and the photosynthetic type in which there are two redox systems one reacting with the holes at the surface of the semiconductor electrode and one reacting with the electrons entering the counter-electrode, for example, water is oxidized to oxygen at the semiconductor photoanode and reduced to hydrogen at the cathode. In the case of the regenerative type of photovoltaic cell, as exemplified by the Graetzel cell, the hole transporting medium may be a liquid electrolyte supporting a redox reaction, a gel electrolyte supporting a redox reaction, an organic hole transporting material, which may be a low molecular weight material such as 2,2',7,7'-tetrakis(N,N-di-p-methoxyphenylamine)9,9'-spirobifluorene (OMeTAD) or triphenylamine compounds or a polymer such as PPV-derivatives, poly(N-vinylcarbazole) etc., or inorganic semiconductors such as CuI, CuSCN etc. The charge transporting process can be ionic as in the case of a liquid electrolyte or gel electrolyte or electronic as in the case of organic or inorganic hole transporting materials.

Such regenerative photovoltaic devices can have a variety of internal structures in conformity with the end use. Conceivable forms are roughly divided into two types: structures which receive light from both sides and those which receive light from one side. An example of the former is a structure made up of a transparently conductive layer e.g. an ITO-layer or a PEDOT/PSS-containing layer and a transparent counter electrode electrically conductive layer e.g. an ITO-layer or a PEDOT/PSS-containing layer having interposed therebetween a photosensitive layer and a charge transporting layer. Such devices preferably have their sides sealed with a polymer, an adhesive or other means to prevent deterioration or volatilization of the inside substances. The external circuit connected to the electrically-conductive substrate and the counter electrode via the respective leads is well-known.

Organic photovoltaic layers of the layer configuration, according to the present invention are, for example, mixtures of fullerene molecules (as electron acceptor and electron transporter) with conjugated polymers (e.g. substituted polyphenylenevinylene (PPV) (as light absorber and hole transporter)[see Brabec et al., Adv. Funct. Mater., volume 11(1), pages 15–26 (2001)]. In 1995 Halls et al. reported in Nature, volume 376, page 498 the successful use of acceptor-type conjugated polymers instead of fullerenes.

Alternatively the layer configuration, according to the present invention, can be incorporated in hybrid photovoltaic compositions such as described in 1991 by Graetzel et al. in Nature, volume 353, pages 737–740, in 1998 by U. Bach et al. [see Nature, volume 395, pages 583–585 (1998)] and in 2002 by W. U. Huynh et al. [see Science, volume 295, pages 2425–2427 (2002)]. In all these cases, at least one of the components (light absorber, electron transporter or hole transporter) is inorganic (e.g. nano-TiO$_2$ as electron transporter, CdSe as light absorber and electron transporter) and at least one of the components is organic (e.g. triphenylamine as hole transporter or poly(3-hexylthiophene) as hole transporter).

Inorganic photovoltaic layers which can be used in the layer configuration according to this invention are described in EP-A 1 176 646 herein incorporated by reference.

Transistors

According to a twenty-fourth embodiment of the layer configuration, according to the present invention, the layer configuration further comprises a layer with one or more of the electron transporting or hole transporting components described above, but within such a configuration that it can be used as a transistor. The semiconductor can be n-type, p-type or both (ambipolar transistor) and can be either organic or inorganic.

INDUSTRIAL APPLICATION

Layer configurations comprising an element, according to the present invention, between a positive electrode and a material capable of hole transport and capable of reducing hole-electron recombination at the positive electrode can be used in a wide range of electronic devices such as photovoltaic devices, solar cells, batteries, capacitors, light emitting diodes, organic and inorganic electroluminescent devices, smart windows, electrochromic devices, sensors for organic and bio-organic materials and field effect transistors [see also chapter 10 of the Handbook of Oligo- and Polythiophenes, Edited by D. Fichou, Wiley-VCH, Weinheim (1999)].

The invention is illustrated hereinafter by way of comparative and invention examples. The percentages and ratios given in these examples are by weight unless otherwise indicated.

Synthesis of PEDOT-S

Synthesis of 2-acetoxymethyl-2,3-dihydro-thieno[3,4-b][1,4]dioxine-5,7-dicarboxylic acid dimethyl ester

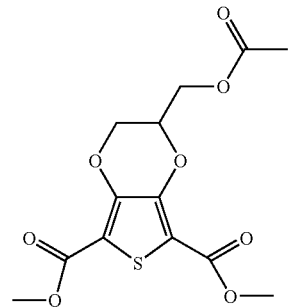

A 70/30 molar mixture of 2-acetoxymethyl-2,3-dihydro-thieno[3,4-b][1,4]dioxine-5,7-dicarboxylic acid dimethyl ester and 3-acetoxy-3,4-dihydro-2H-thieno[3,4-b][1,4]dioxepine-6,8-dicarboxylic acid dimethyl ester was obtained by performing the reaction between 3,4-dihydroxythiophene-2,5-dicarboxylic acid dimethyl ester and epibromohydrin as described in U.S. Pat. No. 5,111,327. This mixture was subsequently separated by an acetylation/selective crystallization procedure: the 70/30 molar mixture of 2-acetoxymethyl-2,3-dihydro-thieno[3,4-b][1,4]dioxine-5,7-dicarboxylic acid dimethyl ester and 3-acetoxy-3,4-dihydro-2H-thieno[3,4-b][1,4]dioxepine-6,8-dicarboxylic acid dimethyl ester (143 g, 0.496 mol) was dissolved in methylene chloride (1.5 L). Triethylamine (80 mL) was subsequently added after which acetyl chloride (43 mL) was added dropwise, constantly keeping the reaction around 25° C. by slight cooling. After addition the mixture was stirred for another hour at 25° C.

Subsequently, the reaction mixture was washed several times with aqueous HCl (1M), aqueous NaHCO$_3$ (1M) and saturated aqueous NaCl, respectively. The solvent was removed and the resulting solid was recrystallized from ethanol. After filtration and washing of the residue, pure 2-acetoxymethyl-2,3-dihydro-thieno[3,4-b][1,4]dioxine-5,7-dicarboxylic acid dimethyl ester was obtained as demonstrated by NMR and mass spectroscopy.

Synthesis of 2-hydroxymethyl-2,3-dihydro-thieno[3,4-b][1,4]dioxine-5,7-dicarboxylic acid

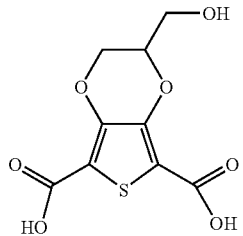

2-Acetoxymethyl-2,3-dihydro-thieno[3,4-b][1,4]dioxine-5,7-dicarboxylic acid dimethyl ester (60 g, 0.18 mol) was dissolved in ethanol (680 mL). KOH (36 g) was added to this solution after which water (500 mL) was added upon continuous cooling. After addition of the water the reaction mixture was stirred for another 30 minutes after which the solvents were removed by distillation. To the remaining part of the reaction mixture, we dropwise added a mixture of ice (50 g) and concentrated HCl (25 mL), and stirred. The mixture was then filtered and the residue was washed with water. Subsequent drying resulted in quantitative formation of pure 2-hydroxymethyl-2,3-dihydro-thieno[3,4-b][1,4]dioxine-5,7-dicarboxylic acid as demonstrated by NMR and mass spectroscopy.

Synthesis of (2,3-dihydro-thieno[3,4-b][1,4]dioxin-2-yl)-methanol

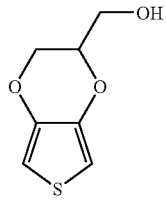

2-Hydroxymethyl-2,3-dihydro-thieno[3,4-b][1,4]dioxine-5,7-dicarboxylic acid (48 g, 0.184 mol) was dissolved in N,N-dimethylacetamide (500 mL), and $Cu_2Cr_2O_7$ (8.6 g) and quinoline (15 drops) were added. This mixture was subsequently stirred for 2 hours at 150° C., after which it was cooled to 25° C. It was then poured into ethyl acetate, the catalyst was removed by filtration and the filtrate was washed with acidic water and aqueous, saturated NaCl. Subsequently, the solvent was removed after which pure (2,3-dihydro-thieno[3,4-b][1,4]dioxin-2-yl)-methanol was isolated by vacuum distillation (115–120° C.; 0.05 mm Hg).

Synthesis of 4-(2,3-dihydro-thieno[3,4-b][1,4]dioxin-2-yl-methoxy)-butane-1-sulphonic acid sodium salt

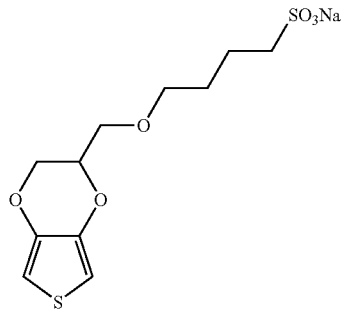

(2,3-Dihydro-thieno[3,4-b][1,4]dioxin-2-yl)-methanol (6.9 g, 40 mmol) was dissolved into tetrahydrofuran (100 mL) and blanketed by nitrogen. NaH (1.76 g) was added and stirring was continued for 30 min. Then butanesultone (6.0 g) was added dropwise after which the reaction mixture was brought to reflux for 3 h. Then it was cooled to 25° C. again, the solvent was removed, methanol 5 was added, the mixture was stirred, filtered and the filtrate was concentrated. The remaining oil was solidified by addition of hexane and ethanol, followed by stirring. Final filtration and drying resulted in pure 4-(2,3-dihydro-thieno[3,4-b][1,4]dioxin-2-ylmethoxy)-butane-1-sulphonic acid sodium salt as was demonstrated by NMR and mass spectroscopy.

Chemical polymerization of 4-(2,3-dihydro-thieno[3,4-b][1,4]-dioxin-2-ylmethoxy)-butane-1-sulphonic acid sodium salt 4-(2,3-dihydro-thieno[3,4-b][1,4]dioxin-2-ylmethoxy)-butane-1-sulphonic acid sodium salt (0.66 g, 2.0 mmol) was dissolved in oxygen-free water (20 mL). The solution was heated to 80° C. after which $Fe(OTs)_3 \cdot 6H_2O$ (4.06 g, 6.0 mmol) was added. The colour of the solution immediately turned dark blue. The reaction mixture was kept at 80° C. for 3.5 h more, after which it was cooled and filtered. The filtrate was finally freed of iron, sodium and tosylate ions by ion exchange with cationic and anionic resins resulting in a dark blue aqueous PEDOT-S solution. The solution was finally diluted with deionized water to 1% by weight PEDOT-S.

Light Emitting Devices 1 to 10

Preparation of the Electroluminescent ZnS:Cu dispersion
The following solutions were prepared:

| Solution 1 | zinc acetate dihydrate | 131.7 g |
|---|---|---|
| | copper acetate monohydrate | 0.54 g |
| | deionized water | to 600 mL |
| Solution 2 | sodium sulphide nonahydrate | 113.6 g |
| | ammonia (50%) | 5 mL |
| | deionized water | to 600 mL |
| Solution 3 | TRI* | 40 g |
| | deionized water | to 1000 mL |
| | sodium chloride | 58.44 g |

*TRI = (5-methyl-1,2,4-triazolo-(1,5-a)-pyrimidine-7-ol)

Solutions 1 and 2 at room temperature were added simultaneously both at a flow rate of 500 mL/min to solution 3, held at room temperature and stirred at 1500 rpm for 60 s. To 1000 mL of the resulting dispersion, 1000 mL of a 1% polyphosphoric acid solution adjusted to pH 6 with ammonium hydroxide was added and the dispersion was concentrated to 1000 mL by means ultrafiltration using a Fresenius F60 cartridge. This dispersion was subsequently diafiltered by using 5500 mL of a 1% solution of polyphosphoric acid solution adjusted to pH 6 with ammonium hydroxide solution in water. The dispersion was further concentrated to a volume of about 570 mL to produce an aqueous dispersion at pH 6 containing 30 g/L ZnS:Cu and 1% polyphosphoric acid. The dispersion was then ball-milled for 1 hour. 20 mL of the resulting dispersion was then ultrasonically treated with an ultrasound bar (Vibra cell VCX 400 W from Sonics & Materials Inc. —amplitude about 78%—output 40%) for 3 minutes while cooling in ice. 3.2 g of a 5% by weight aqueous solution of poly(vinylpyrrolidone) in water was then added to 16.8 g of the ZnS:Cu dispersion followed by further ultrasonic treatment with the ultrasound bar for 5 minutes. 0.5 mL of ZONYL™ FSO100 was then added as a 1% by weight aqueous solution followed by thorough stirring. The resulting dispersion was then filtered through a 5 μm MILLIPORE™ filter, a nano-dispersion of electroluminescent ZnS:Cu being thereby produced.

Preparation of the Patterned ITO Electrode

An indium tin oxide [ITO] layer on 175 μm thick poly (ethylene terephthalate) [PET] from IST, with a surface resistance of about 80 Ohm/square, was used as the hole-conducting electrode. ITO/PET sheets of 5×5 cm$^2$ were taped off in the middle of the plate with a 2 cm Magic tape Scotch 810 from 3M. The sides of the ITO plates were etched with a solution consisting of 50 mL of concentrated hydrochloric acid, 50 mL of deionized water and 4 mL of concentrated nitric acid. After the etching, the ITO/PET sheets were rinsed with water several times and subsequently dried with a hair dryer. After drying, the tape was removed and the sheets were put into a vessel with isopropanol which was put into an ultrasound bath for 10 minutes. Afterwards they were dried at 50° C. for 10 minutes. Each ITO/PET sheet contained a band of 2 cm of conductive ITO in the middle.

Preparation and Application of Electron Blocking Element

The solutions/dispersions were prepared by stirring the ingredients in Table 1 together and then adjusting the pH, or not, as indicated therein.

TABLE 1

| solution nr | POLY-01 [g] | 1% PEDOT-S in H$_2$O at pH = 2.1 [g] | 5% ZONYL™ FSO 100 in H$_2$O [g] | deionized water [g] | pH-adjustment acid | to pH |
|---|---|---|---|---|---|---|
| 4 | — | 2.0 | 0.1 | — | — | — |
| 5 | 0.3 | — | 1 | 48.7 | HCl | 2.5 |
| 6 | 0.65 | — | 1 | 48.35 | HCl | 2.5 |
| 7 | 0.286 | 1.4 | 1 | 47.314 | HCl | 2.5 |
| 8 | 0.25 | 5.0 | 1 | 43.75 | HCl | 2.5 |
| 9 | 0.325 | 32.5 | 1 | 16.175 | HCl | 2.5 |

Solutions 5, 7 and 8 were spincoated on patterned ITO/PET sheets at 800 rpm for 6 s and then at 4000 rpm for 50 s and the elements dried at 40° C. for 10 minutes. This resulted in element thicknesses of about 5 to 10 nm, thereby producing the substrates for devices 3, 4 and 5 respectively.

Solutions 4, 6 and 9 were spincoated on patterned ITO/PET at 800 rpm for 6 s and then at 1500 rpm for 50 s and the elements dried at 40° C. for 10 minutes. This resulted in element thicknesses of about 100 nm, thereby producing the substrates for devices 2, 6 and 7 respectively.

The thicknesses were measured with a DEKTAK™ profilometer with the element spincoated on glass. Similar element thicknesses can be expected on ITO/PET.

Application of the Electroluminescent Layer

On top of the patterned ITO/PET without an electron blocking element, the electroluminescent nano ZnS:Cu-dispersion was spincoated for 6 seconds at 1000 rpm followed by 50 seconds at 2000 rpm. The electroluminescent nano ZnS:Cu-dispersion was applied to the substrates of devices 2 to 25 in the same way on top of the particular blocking element used.

The resulting layers were then dried at 50° C. for 10 minutes, a electroluminescent ZnS:Cu-layer thickness of 100 nm being thereby obtained.

Application of the Aluminium Electrode

Subsequently, a 160 nm thick aluminium electrode (cathode) was vacuum deposited on the spincoated double layers at a vacuum of $1.33 \times 10^{-4}$ N m$^{-2}$ Pa using a mask. The emission area was 25 mm$^2$. The device construction is shown in FIG. 1.

Performance of the Light Emitting Devices

The results for light emitting devices 1 to 7 are given in Table 2.

TABLE 2

| Device nr. | element | pH | Thickness of element [nm] | Lifetime [sec] | Optimum voltage [V] |
|---|---|---|---|---|---|
| 1 (ref.) | No | — | — | 650 | 6.2 |
| 2 (ref.) | PEDOT-S | 2.5 | 100 | 633 | 6.6 |
| 3 (ref.) | POLY-01 Cl$^-$ | 2.5 | 5 | 703 | 6.1 |
| 4 (inv.) | PEDOT-S/POLY-01 (5/100) Cl$^-$ | 2.5 | 5 | 780 | 6.2 |
| 5 (inv.) | PEDOT-S/POLY-01 (20/100) Cl$^-$ | 2.5 | 5 | 920 | 6.4 |
| 6 (ref.) | POLY-01 Cl$^-$ | 2.5 | 100 | 600 | 6.4 |
| 7 (inv.) | PEDOT-S/POLY-01 (50/50) Cl$^-$ | 2.5 | 100 | 750 | 6.3 |

At a forward bias, the devices exhibited electroluminescence with a λmax of 490 nm. For the lifetime measurements, a forward bias was applied and the voltage was increased so as to keep the light output constant at ca. 0.5 Cd/m$^2$. The maximum voltage was 12 V. The lifetime of the light emitting device was taken to be the time between application of the optimum voltage and the moment no further electroluminescence could be observed. The optimum voltage was that voltage at which maximum light output was observed.

It can be concluded from Table 2 that for a partially quaternized polyamine-polymer, POLY-01, with surfaces contiguous with an anode on one side of the element and a material capable of transporting holes on the opposite side, the incorporation therein of a polymer according to formula I, such as PEDOT-S, results in a significant improvement in lifetime in the case of a 5 to 10 nm element. The increase in device lifetime in the case of 100 nm elements is lower but still significant.

Light Emitting Devices 8 and 9

The substrate of light emitting device 8 was prepared by spincoating solution 4 on the patterned ITO/PET sheet at 800 rpm for 6 s and then at 1500 rpm for 50 s to produce a 100 nm thick coating after drying at 40° C. for 10 minutes. Then the resulting coating was spincoated with solution 5 at 800 rpm for 6 s and then at 4000 rpm for 50 s and the resulting element dried at 40° C. for 10 minutes to give a total element thickness of ca. 105 nm, since the water in solution 5 does not substantially redisperse the PEDOT-S coating.

The substrate of light emitting device 9 was prepared by spincoating solution 4 on the patterned ITO/PET sheet at 800 rpm for 6 s and then at 1500 rpm for 50 s to produce a 100 nm thick coating after drying at 40° C. for 10 minutes. Then the resulting coating was spincoated with solution 6 at 800 rpm for 6 s and then at 1500 rpm for 50 s and the resulting element dried at 40° C. for 10 minutes to give an additional ca. 100 nm thickness resulting in a total element thickness of ca. 200 nm, since the water in solution 6 does not substantially redisperse the PEDOT-S coating.

Light emitting elements 8 and 9 were prepared from substrates 8 and 9 by applying the electroluminescent nano ZnS:Cu-dispersion and aluminium electrode as described for light emitting devices 2 to 7.

Performance of the Light Emitting Devices

The results for light emitting devices 8 and 9, obtained as for light emitting devices 1 to 7, are given in Table 3 together with the results for devices 1, 2, 3 and 6 as references.

TABLE 3

| Device nr. | element | pH | Thickness of element/coating [nm] | Life-time [sec] | Optimum voltage [V] |
|---|---|---|---|---|---|
| 1 (ref.) | No | — | — | 650 | 6.2 |
| 2 (ref.) | PEDOT-S | 2.5 | 100 | 633 | 6.6 |
| 3 (ref.) | POLY-01 Cl$^-$ | 2.5 | 5 | 703 | 6.1 |

TABLE 3-continued

| Device nr. | element | pH | Thickness of element/coating [nm] | Life-time [sec] | Optimum voltage [V] |
|---|---|---|---|---|---|
| 8 (inv.) | coating 1: PEDOT-S | 2.5 | 100* | 963 | 6.3 |
|  | coating 2: POLY-01 Cl$^-$ |  | 5* |  |  |
| 6 (ref.) | POLY-01 Cl$^-$ | 2.5 | 100 | 600 | 6.4 |
| 9 (inv.) | coating 1: PEDOT-S | 2.5 | 100* | 800 | 6.5 |
|  | coating 2: POLY-01 Cl$^-$ |  | 100* |  |  |

*theoretical

It can be concluded from Table 3 that for an element containing a polymer according to formula I, such as PEDOT-S, and a partially quaternized polyamine-polymer, POLY-01, applied in separate coatings with the PEDOT-S side of the element contiguous with an anode and a material capable of transporting holes on the POLY-01 side of the element, there is a clear benefit in device lifetime resulting from the incorporation therein of a polymer according to formula I, such as PEDOT-S.

Light Emitting Devices 10 and 11

Light emitting devices 10 and 11 were prepared as described for Devices 2 to 6 except that the patterned ITO electrode was coated with elements incorporating POLY-02. Solutions 10 to 12 used for preparing these elements are given below in Table 4.

Solutions 10 and 12 were spincoated on patterned ITO/PET sheets at 800 rpm for 6 s and then at 4000 rpm for 50 s and the elements dried at 40° C. for 10 minutes. This resulted in element thicknesses of about 5 to 10 nm thereby producing the substrates for Devices 10 and 11 respectively.

TABLE 4

| solution nr | POLY-02 [g] | 1% PEDOT-S in H$_2$O at pH = 2.1 [g] | 5% ZONYL™ FSO 100 in H$_2$O [g] | de-ionized water [g] | pH-adjustment acid | pH-adjustment to pH |
|---|---|---|---|---|---|---|
| 10 | 0.3 | — | 1 | 48.7 | HCl | 2.5 |
| 11 | 0.65 | — | 1 | 48.35 | HCl | 2.5 |
| 12 | 0.25 | 5.0 | 1 | 43.75 | HCl | 2.5 |

Performance of the Light Emitting Devices

The results for light emitting devices 10 and 11, obtained as for light emitting devices 1 to 7, are given in Table 5 together with the results for devices 1 and 2 as references.

It can be concluded from Table 5 that for a partially quaternized polyamine-polymer, POLY-02, with surfaces contiguous with an anode on one side of the element and a material capable of transporting holes on the opposite side, the incorporation therein of a polymer according to formula I, such as PEDOT-S, in a weight ratio to POLY-02 of 1:5 results in a significant improvement lifetime in the case of a 5 to 10 nm element.

TABLE 5

| Device nr. | element | pH | Thickness of element [nm] | Lifetime [sec] | Optimum voltage [V] |
|---|---|---|---|---|---|
| 1 (ref.) | No | — | — | 650 | 6.2 |
| 2 (ref.) | PEDOT-S | 2.5 | 100 | 633 | 6.6 |
| 10 (ref.) | POLY-02 Cl− | 2.5 | 5 | 602 | 6.5 |
| 11 (inv.) | PEDOT-S/POLY-02 (20/100) Cl− | 2.5 | 5 | 850 | 6.1 |

Light Emitting Devices 12 to 14

The substrate of light emitting device 12 was prepared by spincoating solution 11 on patterned ITO/PET at 800 rpm for 6 s and then at 1500 rpm for 50 s to produce a 100 nm thick element after drying at 40° C. for 10 minutes.

The substrate of light emitting device 13 was prepared by spincoating solution 4 on the patterned ITO/PET sheet at 800 rpm for 6 s and then at 1500 rpm for 50 s to produce a 100 nm thick coating after drying at 40° C. for 10 minutes. Then the resulting coating was spincoated with solution 10 at 800 rpm for 6 s and then at 4000 rpm for 50 s and the resulting element dried at 40° C. for 10 minutes to give a total element thickness of ca. 105 nm, since the water in solution 10 does not substantially redisperse the PEDOT-S coating.

The substrate of light emitting device 14 was prepared by spincoating solution 4 on the patterned ITO/PET sheet at 800 rpm for 6 s and then at 1500 rpm for 50 s to produce a 100 nm thick coating after drying at 40° C. for 10 minutes. Then the resulting coating was spincoated with solution 11 at 800 rpm for 6 s and then at 1500 rpm for 50 s and the resulting element dried at 40° C. for 10 minutes to give an additional ca. 100 nm thickness resulting in a total element thickness of ca. 200 nm, since the water in solution 11 does not substantially redisperse the PEDOT-S coating.

Light emitting elements 12 to 14 were prepared from substrates 12 to 14 by applying the electroluminescent nano ZnS:Cu-dispersion and aluminium electrode as described for light emitting devices 2 to 7.

Performance of the Light Emitting Devices

The results for light emitting devices 12 to 14, obtained as for light emitting devices 1 to 7, are given in Table 6 together with the results for devices 1, 2 and 10 as references.

It can be concluded from Table 6 that for an element containing a polymer according to formula I, such as PEDOT-S, and a partially quaternized polyamine-polymer, POLY-02, applied in separate coatings with the PEDOT-S side of the element contiguous with an anode and a material capable of transporting holes on the POLY-02 side of the element, there is a clear benefit in device lifetime resulting from the incorporation therein of a polymer according to formula I, such as PEDOT-S.

TABLE 6

| Device nr. | element | pH | Thickness of element [nm] | Lifetime [sec] | Optimum voltage [V] |
|---|---|---|---|---|---|
| 1 (ref.) | No | — | — | 650 | 6.2 |
| 2 (ref.) | PEDOT-S | 2.5 | 100 | 633 | 6.6 |
| 10 (ref.) | POLY-02 Cl− | 2.5 | 5 | 602 | 6.5 |
| 13 (inv.) | coating 1: PEDOT-S coating 2: POLY-02 Cl− | 2.5 | 100* 5* | 1093 | 6.2 |
| 12 (ref.) | POLY-02 Cl− | 2.5 | 100 | 160 | 6.8 |
| 14 (inv.) | coating 1: PEDOT-S coating 2: POLY-02 Cl− | 2.5 | 100* 100* | 770 | 6.5 |

*theoretical

Light Emitting Devices 15 to 19

Devices 15 to 19 were prepared as described for Devices 2 to 6 except that the patterned ITO electrode was coated with elements incorporating poly(styrenesulphonic acid). Solutions 13 to 17, used for preparing these elements, are given below in Table 7.

TABLE 7

| | solution number [quantities in mL] | | | | |
|---|---|---|---|---|---|
| | 13 | 14 | 15 | 16 | 17 |
| PSS* (6% in $H_2O$ at pH = 1.75) | — | 4.1 | 2 | 2 | 1.7 |
| PEDOT-S (1% in $H_2O$ at pH = 2.1) | 2 | — | — | 0.6 | 2.0 |
| ZONYL ™ FSO100 (5% in $H_2O$) | 0.1 | 0.8 | 0.8 | 0.4 | 0.4 |
| deionized water | — | 15.1 | 18.0 | 7.0 | 5.8 |

*PSS = = poly(styrene sulphonic acid) (>90% sulphonated, $M_n$ ca 40.000 and $M_w$ ca 250.000)

Solutions 13, 14, 16 and 17 were spincoated on patterned ITO/PET sheets at 800 rpm for 6 s and then at 1500 rpm for 50 s and the elements dried at 40° C. for 10 minutes. This resulted in element thicknesses of about 100 nm thereby producing the substrates for devices 16, 17, 18 and 19 respectively.

Performance of the Light Emitting Devices

The results for light emitting devices 15 to 25, obtained as for light emitting devices 1 to 7, are given in Table 8.

TABLE 8

| Device nr. | element | Thickness of element [nm] | Lifetime [sec] | Optimum voltage [V] |
|---|---|---|---|---|
| 15(ref.) | No | — | 25 | 8.0 |
| 16(ref.) | PEDOT-S | 100 | 43 | 7.0 |
| 17(ref.) | PSS | 100 | 65 | 7.5 |
| 18(inv.) | PEDOT-S/PSS (5:100) | 100 | 187 | 5.8 |
| 19(inv.) | PEDOT-S/PSS (20:100) | 100 | 107 | 6.1 |

It can be concluded from Table 8 that for a 100 nm thick polysulpho-polymer element, such as poly(styrenesulphonic acid) (PSS) with surfaces contiguous with an anode on one side of the element and a material capable of transporting holes on the opposite side, the incorporation therein of a polymer according to formula I results in a significant increase in lifetime from 43 to 187 and 107 s respectively versus PEDOT-S element of the same thickness and from 65 to 187 and 107 s respectively versus PSS for weight ratios of PEDOT-S to PSS of 5:100 and 20:100 respectively.

In organic polymer containing covalently bonded sulphogroups between the hole conductor (ITO) and the electroluminescent layer improves the lifetime of the devices. This can probably be explained by preventing electrons reaching the ITO layer. Indeed it was found that the (surface) resistance of the ITO after the lifetime experiments had substantially increased to greater than 1 Mohm/square, indicating that recombination of electrons and holes had taken place in the ITO layer.

Light Emitting Devices 20 to 22

The substrate of device 20 was prepared by spincoating solution 13 on the patterned ITO/PET sheet at 800 rpm for 6 s and then at 1500 rpm for 50 s to produce a 100 nm thick coating after drying at 40° C. for 10 minutes. The resulting coating was then spincoated with solution 15 at 800 rpm for 6 s and then at 4000 rpm for 50 s and the resulting element dried at 40° C. for 10 minutes to give a total element thickness of ca. 105 nm, since the water in solution 15 does not substantially redisperse the PEDOT-S coating.

The substrate of device 21 was prepared by spincoating solution 15 at 800 rpm for 6 s and then at 4000 rpm for 50 s and the resulting element dried at 40° C. for 10 minutes to give an element thickness of 5 to 10 nm.

The substrate of device 22 was prepared by spincoating solution 14 on the patterned ITO/PET sheet at 800 rpm for 6 s and then at 1500 rpm for 50 s to produce a 100 nm thick coating after drying at 40° C. for 10 minutes. Then the resulting coating was spincoated with solution 16 at 800 rpm for 6 s and then at 1500 rpm for 50 s and the resulting element dried at 40° C. for 10 minutes to give an additional ca. 100 nm thickness resulting in a total element thickness of ca. 200 nm, since the water in solution 14 does not substantially redisperse the PEDOT-S coating.

Light emitting elements 20 and 22 were prepared from device substrates 20 and 22 by applying the electroluminescent nano ZnS:Cu-dispersion and aluminium electrode as described for light emitting devices 2 to 7.

Performance of the Light Emitting Devices

The results for light emitting devices 20 to 22, obtained as for light emitting devices 1 to 7, are given in Table 9 together with the results for devices 15, 16 and 17 as references.

It can be concluded from Table 9 that for an element containing a polymer according to formula I, such as PEDOT-S, and a sulphopolymer, PSS, applied in separate coatings with the PEDOT-S side of the element contiguous with an anode and a material capable of transporting holes on the POLY-02 side of the element, there is a clear benefit in device lifetime resulting from the incorporation therein of a polymer according to formula I, such as PEDOT-S.

TABLE 9

| Device nr. | element | Thickness of element [nm] | Lifetime [sec] | Optimum voltage [V] |
|---|---|---|---|---|
| 15(ref.) | No | — | 25 | 8.0 |
| 16(ref.) | PEDOT-S | 100 | 43 | 7.0 |
| 17(ref.) | PSS | 5 | 195 | 6.5 |
| 20(inv.) | coating 1: PEDOT-S coating 2: PSS | 100(theoretical) 5(theoretical) | 730 | 7.2 |
| 21(ref.) | PSS | 100 | 65 | 7.5 |
| 22(inv.) | coating 1: PEDOT-S coating 2: PSS | 100(theoretical) 100(theoretical) | 115 | 6.9 |

Light Emitting Devices 23 to 31

Light emitting devices 23 to 31 were prepared as described for Devices 1 to 6 except that the patterned ITO electrode was coated with EDOT-S layers incorporating polyphosphoric acid, an 84% polyphosphoric acid from ACROS (Cat. No. 19695-0025). Solutions 18 to 27 used for preparing these layers are given below in Table 10.

TABLE 10

| solution nr | 6% aqueous solution of polyphosphoric acid(PPA) [mL] | 1% PEDOT-S in H$_2$O at pH = 2.1 [g] | 5% ZONYL ™ FSO 100 in H$_2$O [mL] | deionized water [mL] |
|---|---|---|---|---|
| 18 | — | 3.0 | 2.0 | — |
| 19 | 2.0 | — | 2.0 | 16.0 |
| 20 | 2.0 | 0.6 | 2.0 | 15.4 |
| 21 | 1.0 | 6.0 | 2.0 | 11.0 |
| 22 | — | 2.0 | 0.2 | — |
| 23 | 4.1 | — | 2.0 | 13.9 |
| 24 | 2.0 | 0.6 | 1.0 | 6.4 |
| 25 | 1.7 | 2.0 | 1.0 | 5.3 |
| 26 | 0.5 | 3.1 | 1.0 | 0.2 |

Solutions 18, 19, 20 and 21 were spincoated on patterned ITO/ET sheets at 800 rpm for 6 s and then 4000 rpm for 50 s and the layers dried at 40° C. for 10 minutes. This resulted in a layer thickness of about 5 to 10 nm thereby producing the substrates for Devices 23, 24, 25 and 26 respectively.

Solutions 22, 23, 24, 25 and 26 were spincoated on patterned ITO/PET at 800 rpm for 6 s and then 1500 rpm for 50 s and the layers dried at 40° C. for 10 minutes. This resulted in a layer thickness of about 100 nm. The substrates for Devices 27, 28, 29, 30 and 31 respectively were thereby produced.

Performance of the Light Emitting Devices

The results for light emitting devices 23 to 31, obtained as for light emitting devices 1 to 6, are given in Table 11 together with the results for device 1 without a layer between the patterned ITO-layer and the electroluminescent layer.

TABLE 11

| Device nr. | layer | Thickness of layer [nm] | Lifetime [sec] | Threshold voltage [V] |
|---|---|---|---|---|
| 1(ref.) | No | — | 650 | 6.2 |
| 23(ref.) | PEDOT-S | 5 | 840 | 6.6 |
| 24(ref.) | PPA | 5 | 580 | 6.1 |
| 25(inv.) | PEDOT-S/PPA (5/100) | 5 | 1050 | 6.3 |

TABLE 11-continued

| Device nr. | layer | Thickness of layer [nm] | Lifetime [sec] | Threshold voltage [V] |
|---|---|---|---|---|
| 26(inv.) | PEDOT-S/PPA (50/50) | 5 | 1040 | 6.2 |
| 27(ref.) | PEDOT-S | 100 | 380 | 7.8 |
| 28(ref.) | PPA | 100 | 480 | 6.3 |
| 29(inv.) | PEDOT-S/PPA (5/100) | 100 | 1160 | 6.2 |
| 30(inv.) | PEDOT-S/PPA (20/100) | 100 | 720 | 6.8 |
| 31(inv.) | PEDOT-S/PPA (50/50) | 100 | 710 | 7.7 |

It can be concluded from Table 11 that for a polyphosphoric acid (PPA), with surfaces contiguous with an anode on one side of the layer and a material capable of transporting holes on the opposite side, the incorporation therein of a polymer according to formula I, such as PEDOT-S, in PEDOT-S/PPA weight ratios of 5:100, 20:100 and 50:50 results in an improvement in lifetime over that obtained with no layer and with PEDOT-S and PPA layers.

The present invention may include any feature or combination of features disclosed herein either implicitly or explicitly or any generalisation thereof irrespective of whether it relates to the presently claimed invention. In view of the foregoing description it will be evident to a person skilled in the art that various modifications may be made within the scope of the invention.

Having described in detail preferred embodiments of the current invention, it will now be apparent to those skilled in the art that numerous modifications can be made therein without departing from the scope of the invention as defined in the following claims. All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Of course, variations of those preferred embodiments will become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

I claim:

1. A layer configuration on a support, said layer configuration comprising a non-photoactive element exclusive of poly(3,4-alkylenedioxythiophene)s and poly(3,4-dialkoxythiophene)s, said element containing a first polymer containing structural units according to formula (I):

in which X and Y are independently O, S, N—$R^1$, Z is —$(CH_2)_m$—$CR^2R^3$—$(CH_2)_n$—; $R^1$ is aryl, $C_{1-18}$-alkyl or hydrogen; $R^2$ is hydrogen or —$(CH_2)_s$—O—$(CH_2)_p$—$SO_3^-$$M^+$; $R^3$ is —$(CH_2)_s$—O—$(CH_2)_p$—$SO_3^-$$M^+$; $M^+$ is a cation; m and n are independently a whole number from 0 to 3; s is a whole number from 0 to 10; and p is a whole number from 1 to 18, and a second polymer different from said first polymer and selected from the group consisting of optionally quaternized polyamine-polymers, polysulpho-polymers, polyphosphoric acids and polyphosphoric acid salts, the surface of one side of said element being contiguous with a positive electrode and the surface on the opposite side of said element being contiguous with a material capable of transporting holes.

2. The layer configuration according to claim 1, wherein said second polymer contains 4-vinylpyridine monomer units.

3. The layer configuration according to claim 1, wherein said second polymer is selected from the group consisting of: a copolymer of acrylamide and 4-vinylpyridine, a terpolymer of arylamide, 4-vinylpyridine and N-vinylimidazole, and poly(styrenesulphonic acid).

4. The layer configuration according to claim 1, wherein said first polymer is a polythiophene according to formula (II)

in which X and Y are independently O, S, N—$R^1$, Z is —$(CH_2)_m$—$CR^2R^3$—$(CH_2)_n$—; $R^1$ is aryl, $C_{1-18}$-alkyl or hydrogen; $R^2$ is hydrogen or —$(CH_2)_s$—O—$(CH_2)_p$—$SO_3^-$$M^+$; $R^3$ is —$(CH_2)_s$—O—$(CH_2)_p$—$SO_3^-$$M^+$; $M^+$ is a cation; m and n are independently a whole number from 0 to 3; s is a whole number from 0 to 10; and p is a whole number from 1 to 18; and q is a whole number from 2 to 10,000.

5. The layer configuration according to claim 1, wherein said first polymer is poly[4-(2,3-dihydro-thieno[3,4-b][1,4] dioxin-2-ylmethoxy)-butane-1-sulphonic acid].

6. A light emitting diode consisting of a layer configuration on a support, said layer configuration comprising a non-photoactive element exclusive of poly(3,4-alkylene-dioxythiophene)s and poly(3,4-dialkoxythiophene)s, said element containing a first polymer containing structural units according to formula (I):

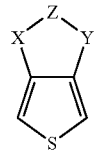
(I)

in which X and Y are independently O, S, N—$R^1$, Z is —$(CH_2)_m$—$CR^2R^3$—$(CH_2)_n$—; $R^1$ is aryl, $C_{1-18}$-alkyl or hydrogen; $R^2$ is hydrogen or —$(CH_2)_s$—O—$(CH_2)_p$—$SO_3^-$ $M^+$; $R^3$ is —$(CH_2)_s$—O—$(CH_2)_p$—$SO_3^-M^+$; $M^+$ is a cation; m and n are independently a whole number from 0 to 3; s is a whole number from 0 to 10; and p is a whole number from 1 to 18, and a second polymer different from said first polymer and selected from the group consisting of optionally quaternized polyamine-polymers, polysulpho-polymers, polyphosphoric acids and polyphosphoric acid salts, the surface of one side of said element being contiguous with a positive electrode and the surface on the opposite side of said element being contiguous with a material capable of transporting holes.

7. The light emitting diode according to claim 6, wherein said second polymer contains 4-vinylpyridine monomer units.

8. The light emitting diode according to claim 6, wherein said second polymer is selected from the group consisting of: a copolymer of acrylamide and 4-vinylpyridine, a terpolymer of arylamide, 4-vinylpyridine and N-vinylimidazole, and poly(styrenesulphonic acid).

9. The light emitting diode according to claim 6, wherein said first polymer is a polythiophene according to formula (II)

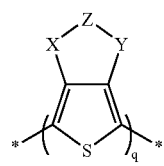
(II)

in which X and Y are independently O, S, N—$R^1$, Z is —$(CH_2)_m$—$CR^2R^3$—$(CH_2)_n$—; $R^1$ is aryl, $C_{1-18}$-alkyl or hydrogen; $R^2$ is hydrogen or —$(CH_2)_s$—O—$(CH_2)_p$—$SO_3^-$ $M^+$; $R^3$ is —$(CH_2)_s$—O—$(CH_2)_p$—$SO_3^-M^+$; $M^+$ is a cation; m and n are independently a whole number from 0 to 3; s is a whole number from 0 to 10; and p is a whole number from 1 to 18; and q is a whole number from 2 to 10,000.

10. The light emitting diode according to claim 6, wherein said first polymer is poly[4-(2,3-dihydro-thieno[3,4-b][1,4]dioxin-2-ylmethoxy)-butane-1-sulphonic acid].

11. A photovoltaic device consisting of a layer configuration on a support, said layer configuration comprising a non-photoactive element exclusive of poly(3,4-alkylenedioxythiophene)s and poly(3,4-dialkoxythiophene)s, said element containing a first polymer containing structural units according to formula (I):

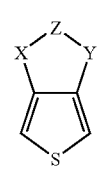
(I)

in which X and Y are independently O, S, N—$R^1$, Z is —$(CH_2)_m$—$CR^2R^3$—$(CH_2)_n$—; $R^1$ is aryl, $C_{1-18}$-alkyl or hydrogen; $R^2$ is hydrogen or —$(CH_2)_s$—O—$(CH_2)_p$—$SO_3^-$ $M^+$; $R^3$ is —$(CH_2)_s$—O—$(CH_2)_p$—$SO_3^-M^+$; $M^+$ is a cation; m and n are independently a whole number from 0 to 3; s is a whole number from 0 to 10; and p is a whole number from 1 to 18, and a second polymer different from said first polymer and selected from the group consisting of optionally quaternized polyamine-polymers, polysulpho-polymers, polyphosphoric acids and polyphosphoric acid salts, the surface of one side of said element being contiguous with a positive electrode and the surface on the opposite side of said element being contiguous with a material capable of transporting holes.

12. The photovoltaic device according to claim 11, wherein said second polymer contains 4-vinylpyridine monomer units.

13. The photovoltaic device according to claim 11, wherein said second polymer is selected from the group consisting of: a copolymer of acrylamide and 4-vinylpyridine, a terpolymer of arylamide, 4-vinylpyridine and N-vinylimidazole, and poly(styrenesulphonic acid).

14. The photovoltaic device according to claim 11, wherein said first polymer is a polythiophene according to formula (II)

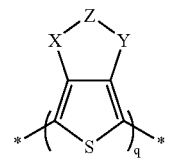
(II)

in which X and Y are independently O, S, N—$R^1$, Z is —$(CH_2)_m$—$CR^2R^3$—$(CH_2)_n$—; $R^1$ is aryl, $C_{1-18}$-alkyl or hydrogen; $R^2$ is hydrogen or —$(CH_2)_s$—O—$(CH_2)_p$—$SO_3^-$ $M^+$; $R^3$ is —$(CH_2)_s$—O—$(CH_2)_p$—$SO_3^-M^+$; $M^+$ is a cation; m and n are independently a whole number from 0 to 3; s is a whole number from 0 to 10; and p is a whole number from 1 to 18; and q is a whole number from 2 to 10,000.

15. The photovoltaic device according to claim 11, wherein said first polymer is poly[4-(2,3-dihydro-thieno[3,4-b][1,4]dioxin-2-ylmethoxy)-butane-1-sulphonic acid].

16. A transistor consisting of a layer configuration on a support, said layer configuration comprising a non-photoactive element exclusive of poly(3,4-alkylenedioxythiophene)s and poly(3,4-dialkoxythiophene)s, said element comprising a first polymer containing structural units according to formula (I):

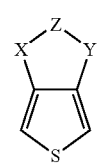
(I)

in which X and Y are independently O, S, N—$R^1$, Z is —$(CH_2)_m$—$CR^2R^3$—$(CH_2)_n$—; $R^1$ is aryl, $C_{1-18}$-alkyl or hydrogen; $R^2$ is hydrogen or —$(CH_2)_s$—O—$(CH_2)_p$—$SO_3^-$ $M^+$; $R^3$ is —$(CH_2)_s$—O—$(CH_2)_p$—$SO_3^-M^+$; $M^+$ is a cation; m and n are independently a whole number from 0 to 3; s is a whole number from 0 to 10; and p is a whole number from 1 to 18, and a second polymer different from said first polymer and selected from the group consisting of optionally quaternized polyamine-polymers, polysulpho-polymers, polyphosphoric acids and polyphosphoric acid salts, the surface of one side of said element being contiguous with a positive electrode and the surface on the opposite side of said element being contiguous with a material capable of transporting holes.

17. The transistor according to claim 16, wherein said second polymer contains 4-vinylpyridine monomer units.

18. The transistor according to claim 16, wherein said second polymer is selected from the group consisting of: a copolymer of acrylamide and 4-vinylpyridine, a terpolymer of arylamide, 4-vinylpyridine and N-vinylimidazole, and poly(styrenesulphonic acid).

19. The transistor according to claim 16, wherein said first polymer is a polythiophene according to formula (II)

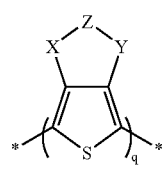

(II)

in which X and Y are independently O, S, N—$R^1$, Z is —$(CH_2)_m$—$CR^2R^3(CH_2)_n$—; $R^1$ is aryl, $C_{1-18}$-alkyl or hydrogen; $R^2$ is hydrogen or —$(CH_2)_s$—O—$(CH_2)_p$—$SO_3^-$ $M^+$; $R^3$ is —$(CH_2)_s$—O—$(CH_2)_p$—$SO_3^-M^+$; $M^+$ is a cation; m and n are independently a whole number from 0 to 3; s is a whole number from 0 to 10; and p is a whole number from 1 to 18; and q is a whole number from 2 to 10,000.

20. The transistor according to claim 16, wherein said first polymer is poly[4-(2,3-dihydro-thieno[3,4-b][1,4]dioxin-2-ylmethoxy)-butane-1-sulphonic acid].

21. An electroluminescent device consisting of a layer configuration on a support, said layer configuration comprising a non-photoactive element exclusive of poly(3,4-alkylenedioxythiophene)s and poly(3,4-dialkoxythiophene)s, said element containing a first polymer containing structural units according to formula (I):

(I)

in which X and Y are independently O, S, N—$R^1$, Z is —$(CH_2)_m$—$CR^2R^3$—$(CH_2)_n$—; $R^1$ is aryl, $C_{1-18}$-alkyl or hydrogen; $R^2$ is hydrogen or —$(CH_2)_s$—O—$(CH_2)_p$—$SO_3^-$ $M^+$; $R^3$ is —$(CH_2)_s$—O—$(CH_2)_p$—$SO_3^-M^+$; $M^+$ is a cation; m and n are independently a whole number from 0 to 3; s is a whole number from 0 to 10; and p is a whole number from 1 to 18, and a second polymer different from said first polymer and selected from the group consisting of optionally quaternized polyamine-polymers, polysulpho-polymers, polyphosphoric acids and polyphosphoric acid salts, the surface of one side of said element being contiguous with a positive electrode and the surface on the opposite side of said element being contiguous with a material capable of transporting holes.

22. The electroluminescent device according to claim 21, wherein said second polymer contains 4-vinylpyridine monomer units.

23. The electroluminescent device according to claim 21, wherein said second polymer is selected from the group consisting of: a copolymer of acrylamide and 4-vinylpyridine, a terpolymer of arylamide, 4-vinylpyridine and N-vinylimidazole, and poly(styrenesulphonic acid).

24. The electroluminescent device according to claim 21, wherein said first polymer is a polythiophene according to formula (II)

(II)

in which X and Y are independently O, S, N—$R^1$, Z is —$(CH_2)_m$—$CR^2R^3$—$(CH_2)_n$—; $R^1$ is aryl, $C_{1-18}$-alkyl or hydrogen; $R^2$ is hydrogen or —$(CH_2)_s$—O—$(CH_2)_p$—$SO_3^-$ $M^+$; $R^3$ is —$(CH_2)S$—O—$(CH_2)_p$—$SO_3^-M^+$; $M^+$ is a cation; m and n are independently a whole number from 0 to 3; s is a whole number from 0 to 10; and p is a whole number from 1 to 18; and q is a whole number from 2 to 10,000.

25. The electroluminescent device according to claim 21, wherein said first polymer is poly[4-(2,3-dihydro-thieno[3,4-b][1,4]dioxin-2-ylmethoxy)-butane-1-sulphonic acid].

26. The layer configuration according to claim 5, wherein said second polymer is selected from the group consisting of: a copolymer of acrylamide and 4-vinylpyridine, a terpolymer of arylamide, 4-vinylpyridine and N-vinylimidazole, and poly(styrenesulphonic acid).

27. The light emitting diode according to claim 10, wherein said second polymer is selected from the group consisting of: a copolymer of acrylamide and 4-vinylpyridine, a terpolymer of axylaniide, 4-vinylpyridine and N-vinylimidazole, and poly(styrenesulphonic acid).

28. The photovoltaic device according to claim 15, wherein said second polymer is selected from the group consisting of: a copolymer of acrylamide and 4-vinylpyridine, a terpolymer of arylamide, 4-vinylpyridine and N-vinylimidazole, and poly(styrenesulphonic acid).

29. The transistor according to claim 20, wherein said second polymer is selected from the group consisting of: a copolymer of acrylamide and 4-vinylpyridine, a terpolymer of arylamide, 4-vinylpyridine and N-vinylimidazole, and poly(styrenesulphonic acid).

30. The electroluminescent device according to claim 25, wherein said second polymer is selected from the group consisting of: a copolymer of acrylamide and 4-vinylpyridine, a terpolymer of arylamide, 4-vinylpyridine and N-vinylimidazole, and poly(styrenesulphonic acid).

* * * * *